(12) United States Patent
Hsu et al.

(10) Patent No.: US 10,622,336 B2
(45) Date of Patent: Apr. 14, 2020

(54) MANUFACTURING METHOD OF SEMICONDUCTOR PACKAGE

(71) Applicant: TAIWAN SEMICONDUCTOR MANUFACTURING COMPANY LTD., Hsinchu (TW)

(72) Inventors: Feng-Cheng Hsu, New Taipei (TW); Jui-Pin Hung, Hsinchu (TW); Shin-Puu Jeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/205,916

(22) Filed: Nov. 30, 2018

(65) Prior Publication Data

US 2019/0103382 A1    Apr. 4, 2019

Related U.S. Application Data

(62) Division of application No. 15/239,295, filed on Aug. 17, 2016, now Pat. No. 10,475,769.
(Continued)

(51) Int. Cl.
*H01L 25/065* (2006.01)
*H01L 23/00* (2006.01)
(Continued)

(52) U.S. Cl.
CPC ......... *H01L 25/0657* (2013.01); *H01L 21/78* (2013.01); *H01L 23/3128* (2013.01);
(Continued)

(58) Field of Classification Search
CPC ................ H01L 24/09; H01L 24/13; H01L 2224/02372; H01L 2224/48091;
(Continued)

(56) References Cited

U.S. PATENT DOCUMENTS

| 9,048,222 B2 * | 6/2015 | Hung ............... H01L 23/481 |
| 2013/0200529 A1 * | 8/2013 | Lin ................. H01L 23/49827 |
| | | 257/777 |

(Continued)

FOREIGN PATENT DOCUMENTS

CN    105679681 A    6/2016

OTHER PUBLICATIONS

Office Action and Search Report dated Apr. 1, 2019 by China National Intellectual Property Administration (CNIPA) for counterpart application No. 201710416694.0.
(Continued)

*Primary Examiner* — Jasmine J Clark
(74) *Attorney, Agent, or Firm* — WPAT, P.C., Intellectual Property Attorneys; Anthony King

(57) ABSTRACT

The present disclosure provides a method for manufacturing a semiconductor package. The method includes providing a carrier, forming a semiconductor die layer over the carrier, and exposing the conductive contact from a close end of the insulating layer by an etching operation. Forming the semiconductor die layer includes forming an insulating layer over the carrier, forming a trench having a close end and an open end in the insulating layer, forming a conductive contact in the trench, and placing a semiconductor die over the insulating layer.

20 Claims, 22 Drawing Sheets

Related U.S. Application Data

(60) Provisional application No. 62/353,826, filed on Jun. 23, 2016.

(51) Int. Cl.
    *H01L 21/78*     (2006.01)
    *H01L 23/31*     (2006.01)
    *H01L 23/522*     (2006.01)
    *H01L 25/10*     (2006.01)
    *H01L 25/00*     (2006.01)
    *H01L 27/108*     (2006.01)

(52) U.S. Cl.
CPC .......... *H01L 23/5226* (2013.01); *H01L 24/09* (2013.01); *H01L 24/13* (2013.01); *H01L 24/19* (2013.01); *H01L 24/97* (2013.01); *H01L 25/105* (2013.01); *H01L 25/50* (2013.01); *H01L 27/108* (2013.01); *H01L 24/16* (2013.01); *H01L 24/32* (2013.01); *H01L 24/48* (2013.01); *H01L 24/73* (2013.01); *H01L 24/92* (2013.01); *H01L 2224/02372* (2013.01); *H01L 2224/0401* (2013.01); *H01L 2224/04105* (2013.01); *H01L 2224/12105* (2013.01); *H01L 2224/131* (2013.01); *H01L 2224/16227* (2013.01); *H01L 2224/16238* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2224/81005* (2013.01); *H01L 2224/83005* (2013.01); *H01L 2224/92244* (2013.01); *H01L 2224/97* (2013.01); *H01L 2225/0651* (2013.01); *H01L 2225/06548* (2013.01); *H01L 2225/06568* (2013.01); *H01L 2225/1035* (2013.01); *H01L 2225/1058* (2013.01); *H01L 2924/15311* (2013.01); *H01L 2924/181* (2013.01); *H01L 2924/18161* (2013.01)

(58) Field of Classification Search
CPC ............. H01L 23/5226; H01L 23/3128; H01L 2225/06548; H01L 2225/1058; H01L 2225/06568; H01L 2225/0651; H01L 25/50; H01L 25/0657; H01L 25/105; H01L 24/97; H01L 24/19
See application file for complete search history.

(56) References Cited

U.S. PATENT DOCUMENTS

| | | |
|---|---|---|
| 2014/0252647 A1 | 9/2014 | Huang et al. |
| 2015/0318262 A1* | 11/2015 | Gu .................. H01L 23/49811 257/738 |
| 2017/0084596 A1 | 3/2017 | Scanlan |
| 2017/0141063 A1 | 5/2017 | Lee et al. |
| 2018/0061668 A1 | 3/2018 | Chen et al. |

OTHER PUBLICATIONS

Foreign Patent Document CN105679681A is a family patent to US Patent Publication 20180061668.
Non-Final Office Action of the U.S. Appl. No. 16/421,327 dated Jan. 24, 2020.
Ex Parte Quayle of the U.S. Appl. No. 16/597,474 dated Jan. 24, 2020.

* cited by examiner

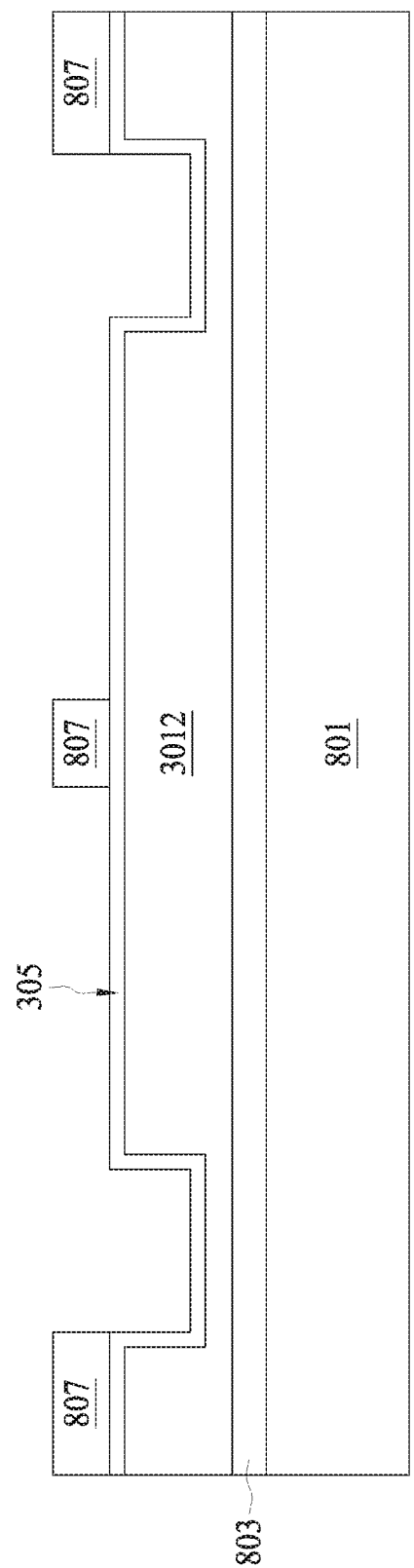

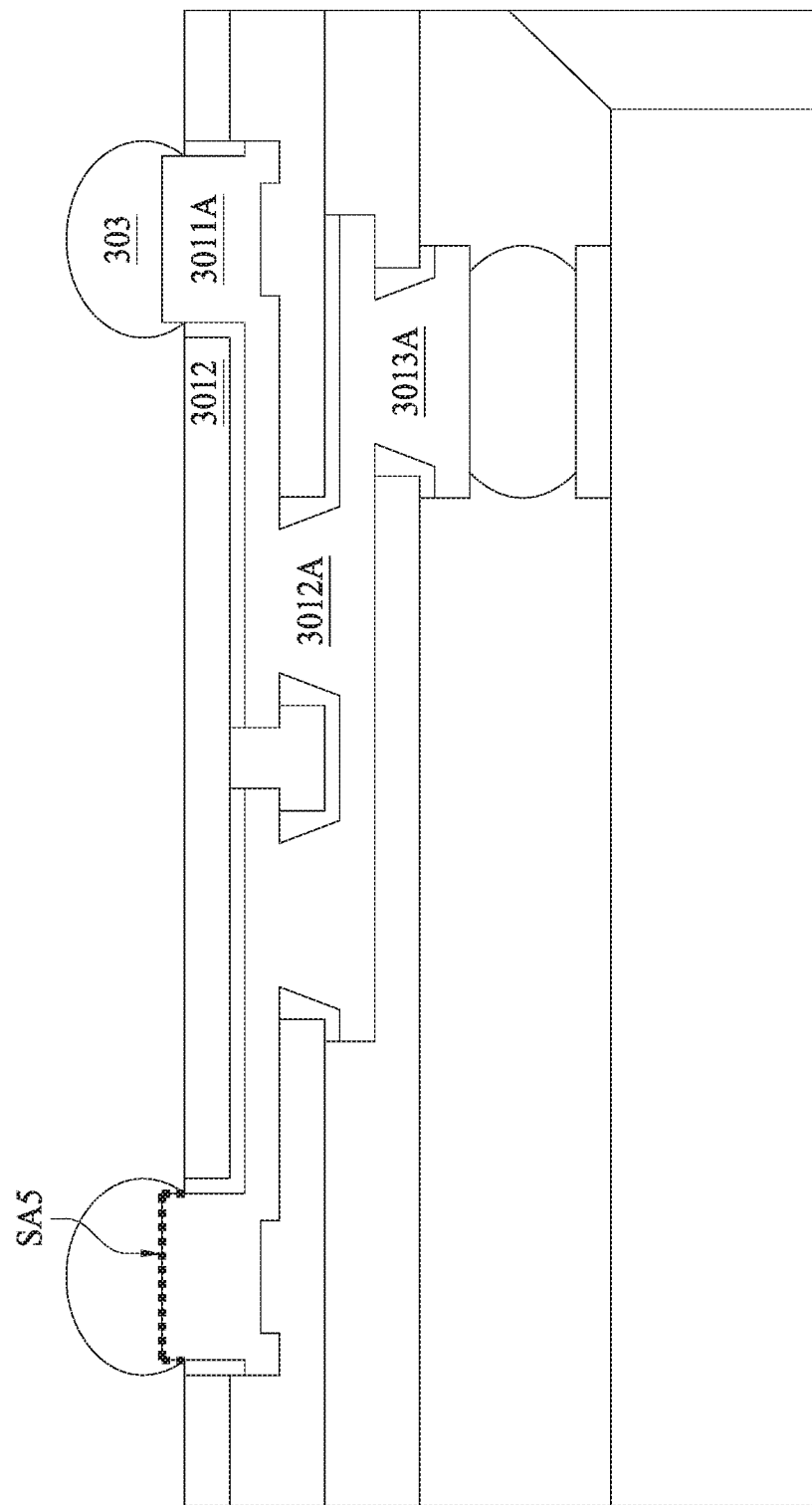

MANUFACTURING METHOD OF SEMICONDUCTOR PACKAGE

PRIORITY CLAIM AND CROSS REFERENCE

This application is a divisional application to U.S. non-provisional application Ser. No. 15/239,295, filed Aug. 17, 2016, which is a regular application to U.S. provisional application No. 62/353,826, filed Jun. 23, 2016, and claims priority thereto.

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices. For example, in an attempt to further increase circuit density, three-dimensional (3D) ICs have been investigated.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8A to FIG. 8H show cross sectional views of a sequence of a method for manufacturing a semiconductor package, in accordance with some embodiments of the present disclosure.

DETAILED DESCRIPTION

Figure 1:
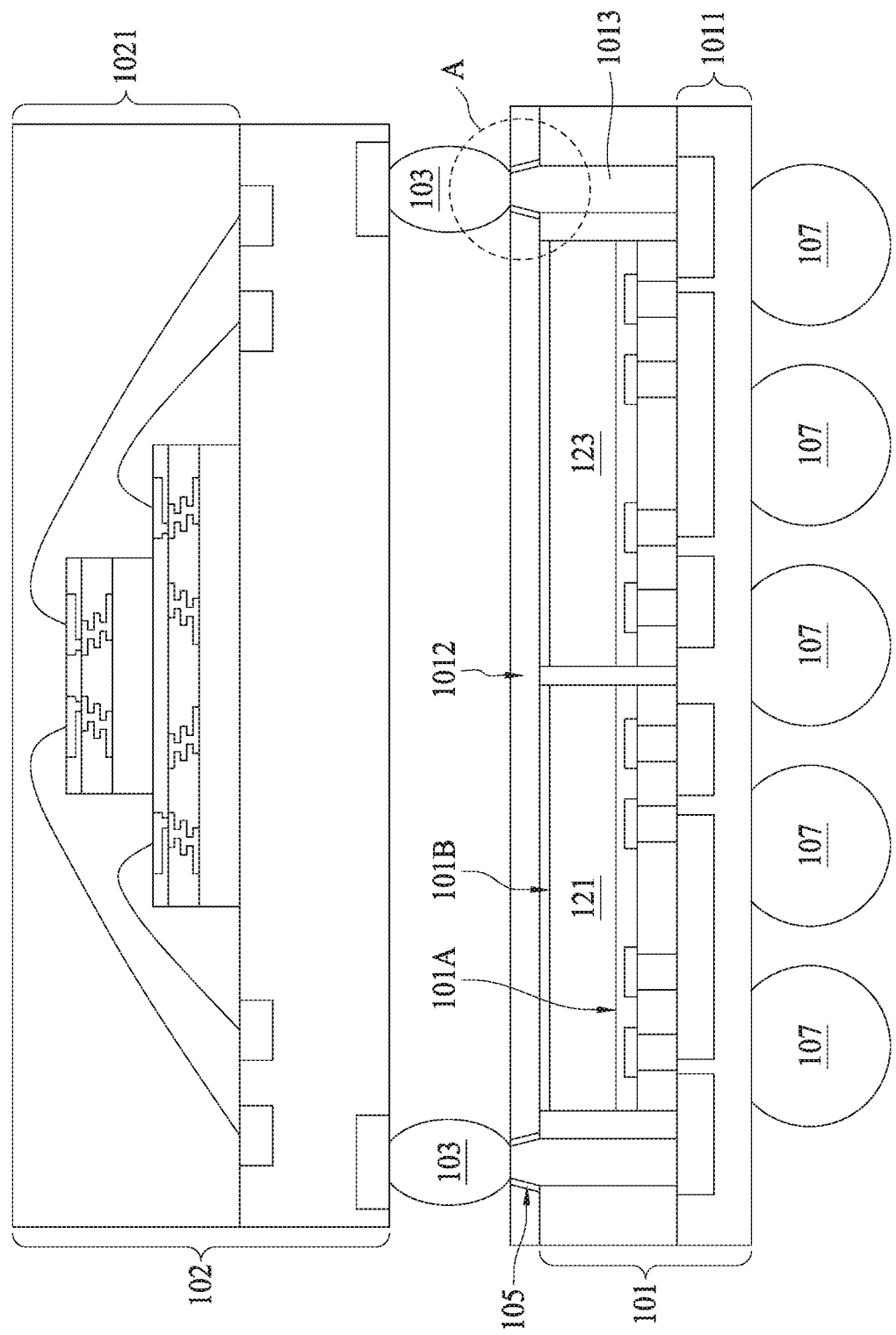
FIG. 1 is a cross sectional view of a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Various embodiments include methods and corresponding structures for forming a semiconductor device package. Various embodiments integrate multiple functional chips in a single device package and implements Chip-to-Wafer (e.g., known good die) for Chip-on-Wafer (CoW) level packaging. Functional chips may be directly bonded to other functional chips using bonding layers (e.g., by fusion bonding and/or hybrid bonding) in order to reduce the need to form solder bumps (e.g., microbumps) and underfill. Various embodiments may further advantageously provide a system-in-package (SiP) solution with smaller form factor, increased input/output density, and low via aspect ratio. Thus, manufacturing errors and costs can be reduced.

This application relates to a semiconductor package and its manufacturing method, and more particularly to a semiconductor package having constant manufacturing cost with increasing conductive pad counts, e.g., I/O counts, per chip and a manufacturing method thereof.

The trend of higher I/O counts per chip is in urgent need. Conventional laser drill operation to open I/O contact from a polymer layer is suffered from low critical dimension uniformity and high overlay shift, rendering delamination between the polymer layer and molding compound surrounding the I/O bump. A greater area enclosure of the I/O contact shall be preserved as a penalty for the laser drill operation, and hence the pitch of the I/O bump cannot be shrinked. Normally a 20 micrometer thick circumferencial region is preserved for the laser drilling overlay problem.

The general purpose of the present disclosure provides one or more of the following advantages: (1) forming smaller pitch I/O bump at constant cost; (2) capable for manufacturing both small and large pitch I/O bump; (3) requiring smaller area enclosure, e.g., smaller than a 7 micrometer thick circumferencial region, because of good critical dimension uniformity and smaller overlay shift; (4) decreasing critical dimension of the I/O bump; (5) providing better solder-I/O bump joint strength; (6) providing lower backside packaging joint standoff height.

The present disclosure provides a semiconductor package with a shallow trench in the polymer layer prior to the formation of an I/O bump. The shallow trench may possess a tapered sidewall. A seed layer is between the tapered sidewall of a shallow trench and the I/O bump.

The present disclosure also provides a manufacturing method of a semiconductor package. The method comprises forming a shallow trench in a polymer layer by a lithography operation, forming an I/O bump in the shallow trench, and etching the polymer layer to expose the I/O bump.

Referring to FIG. 1, FIG. 1 is a cross sectional view of a semiconductor package 10, in accordance with some embodiments of the present disclosure. Semiconductor package 10 includes a first semiconductor die layer 101 and a second semiconductor die layer 102. Second semiconductor die layer 102 further includes a packaged die 1021. Packaged die 1021 has a, for example, stacked die encapsulated by molding compound and disposed over a carrier. The stacked die includes multiple dies vertically stacked and wire-bonded to the conductive traces on the carrier. Wire bonding can be used to make the electrical connections from chip components such as chip resistors or chip capacitors to substrate. Two function chips are stacked on top of a plurality of substrate layers. The chips are connected to the substrate by a plurality of bonding gold wires. Other form of wires such as aluminum wire can be used, too. The function chips, the gold wire, and the substrate form a wire bonding (WB) package. In some embodiments, the packaged die 1021 is a memory die, e.g., a DRAM or a NAND flash. The molding compound can be an epoxy, polyimide, silicone rubber, the like, or a combination thereof. The molding compound can be applied using acceptable techniques, such as compression molding. As shown in FIG. 1, the first semiconductor die layer 101 includes an active surface 101A and a passive surface 101B or a back surface. The passive surface 101B is encapsulated by molding compound and an insulating layer 1012 is disposed over the passive surface 101B. In some embodiments, as not shown in FIG. 1, the insulating layer 1012 is in direct contact with the passive surface 101B.

First semiconductor die layer 101 broadly includes a plurality of dies 121, 123, and electrical connection extending from the active surface 101A of the dies 121, 123. In some embodiments, dies 121, 123 are silicon-on-chip (SOC) die flip-chip bonded to redistribution layer (RDL) 1011. For example, the electrical connection connects the active surface 101A of die 121 to the RDL 1011, and further to a solder bump 103 through a conductive contact 1013. In some embodiments, the solder bump 103 is a controlled collapse chip connection (C4) bump. Active surface 101A includes interconnect structure extending from the body of the dies 121, 123. Interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMD layers may include low-k dielectric materials having k values, for example, lower than about 4.0 or even 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Interconnect structure electrically connects various active devices to form functional circuits within dies 121, 123, The functions provided by such circuits may include logic structures, memory structures, processing structures, sensors, amplifiers, power distribution, input/output circuitry, or the like. One of ordinary skill in the art will appreciate that the above examples are provided for illustrative purposes only to further explain applications of various embodiments and are non-limiting. Other circuitry may be used as appropriate for a given application.

Figure 3:
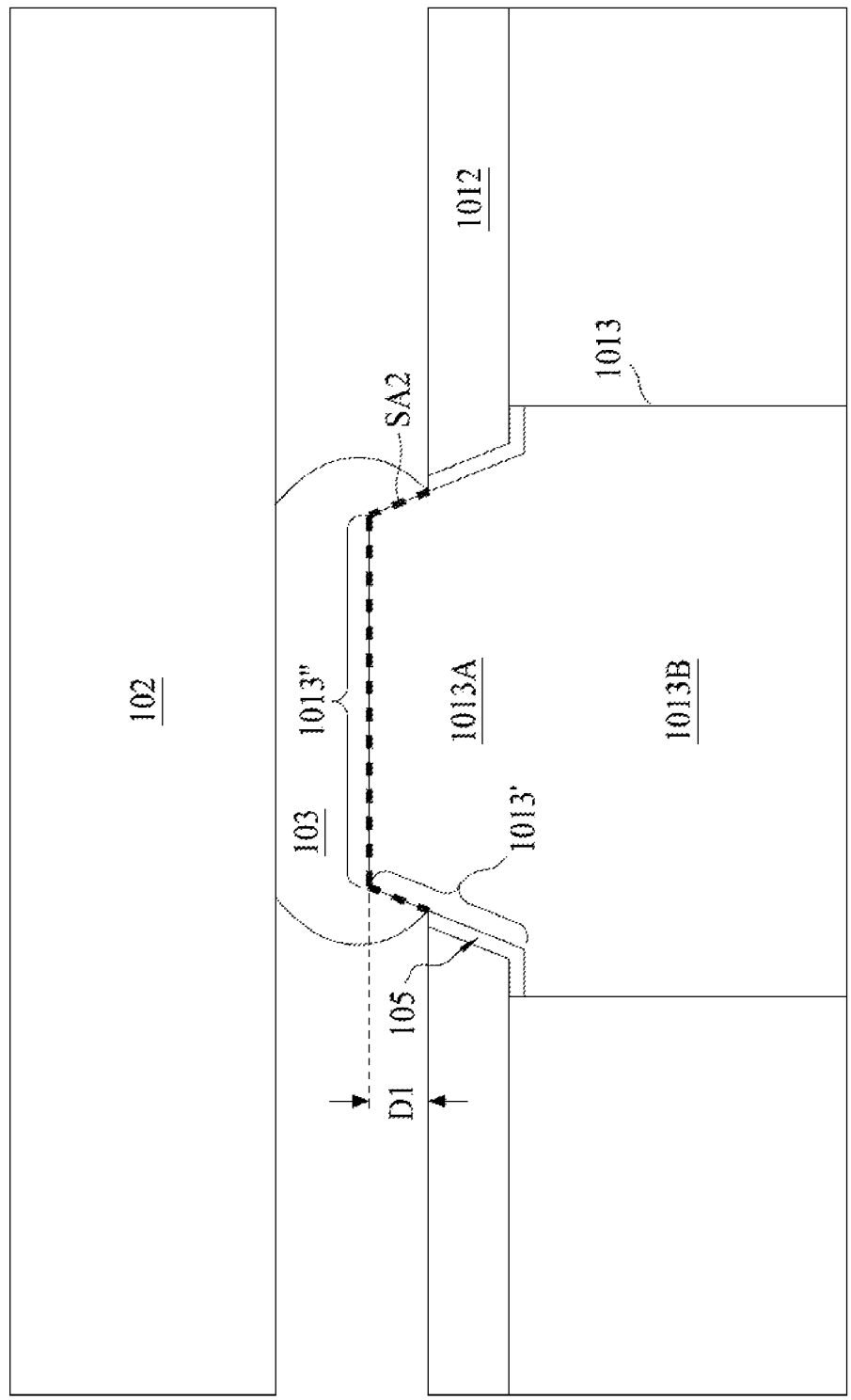
FIG. 3 shows a portional enlarged cross sectional view of a semiconductor package, in accordance with some embodiments of the present disclosure.
Figure 4:
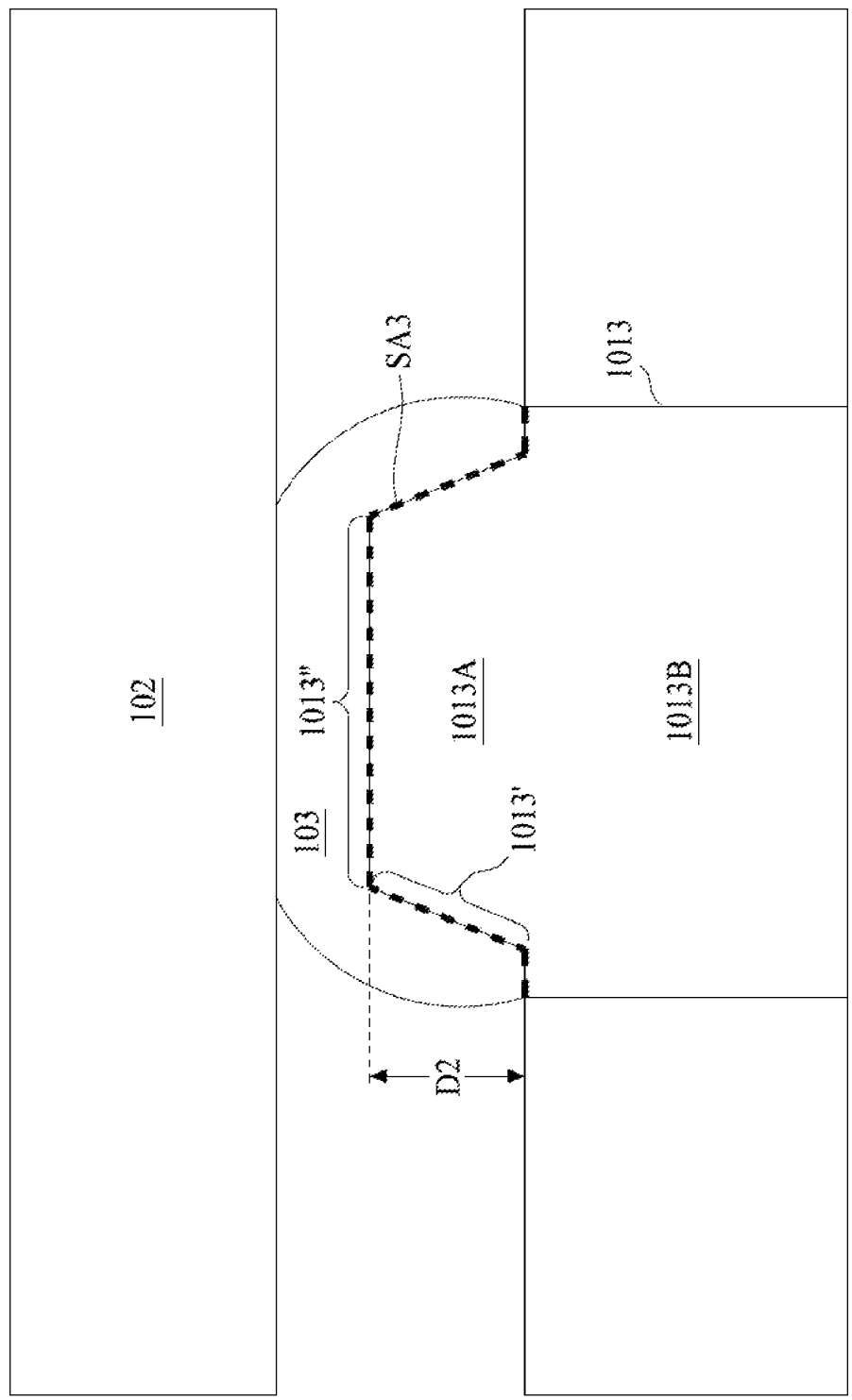
FIG. 4 shows a portional enlarged cross sectional view of a semiconductor package, in accordance with some embodiments of the present disclosure.

As shown in FIG. 1, the conductive contact 1013 is a through insulator via (TIV) penetrating through the molding compound encapsulating dies 121, 123 and the insulating layer 1012. Alternatively stated, a portion of the sidewall of the TIV is surrounded by the insulating layer 1012. In some embodiments, a seed layer 105 can be observed between the portion of the sidewall of the TIV and the insulating layer 1012. Details of the joint A between the TIV and the solder bump 103 are illustrated in FIG. 2 to FIG. 4 of the present disclosure.

In some embodiments, the dies 121, 123 can be known good dies (KGD) determined by a testing or probing operation. The KGD is attached using a pick-and-place tool. A basic flip-chip (FC) packaging technology comprises an IC, an interconnect system, and a substrate. A function chip is connected to the substrate with a plurality of solder bumps, wherein the solder bumps forming a metallurgical interconnection between the chip and the substrate. The function chip, the solder bump, and the substrate form a flip-chip package.

As shown in FIG. 1, semiconductor package 10 further includes a ball grid array (BGA) 107 electrically coupled to the first semiconductor die layer 101 and the second semiconductor die layer 102 through the RDL 1011 and conductive contact 1013, respectively. BGA packaging technology generally is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The BGA allows the semiconductor package to be bonded and electrically connected to an external PCB or other electronic devices. As shown in FIG. 1, the BGA 107 is closer to the active surface 101A than the passive surface 101B of the first semiconductor die layer 101.

Figure 2:
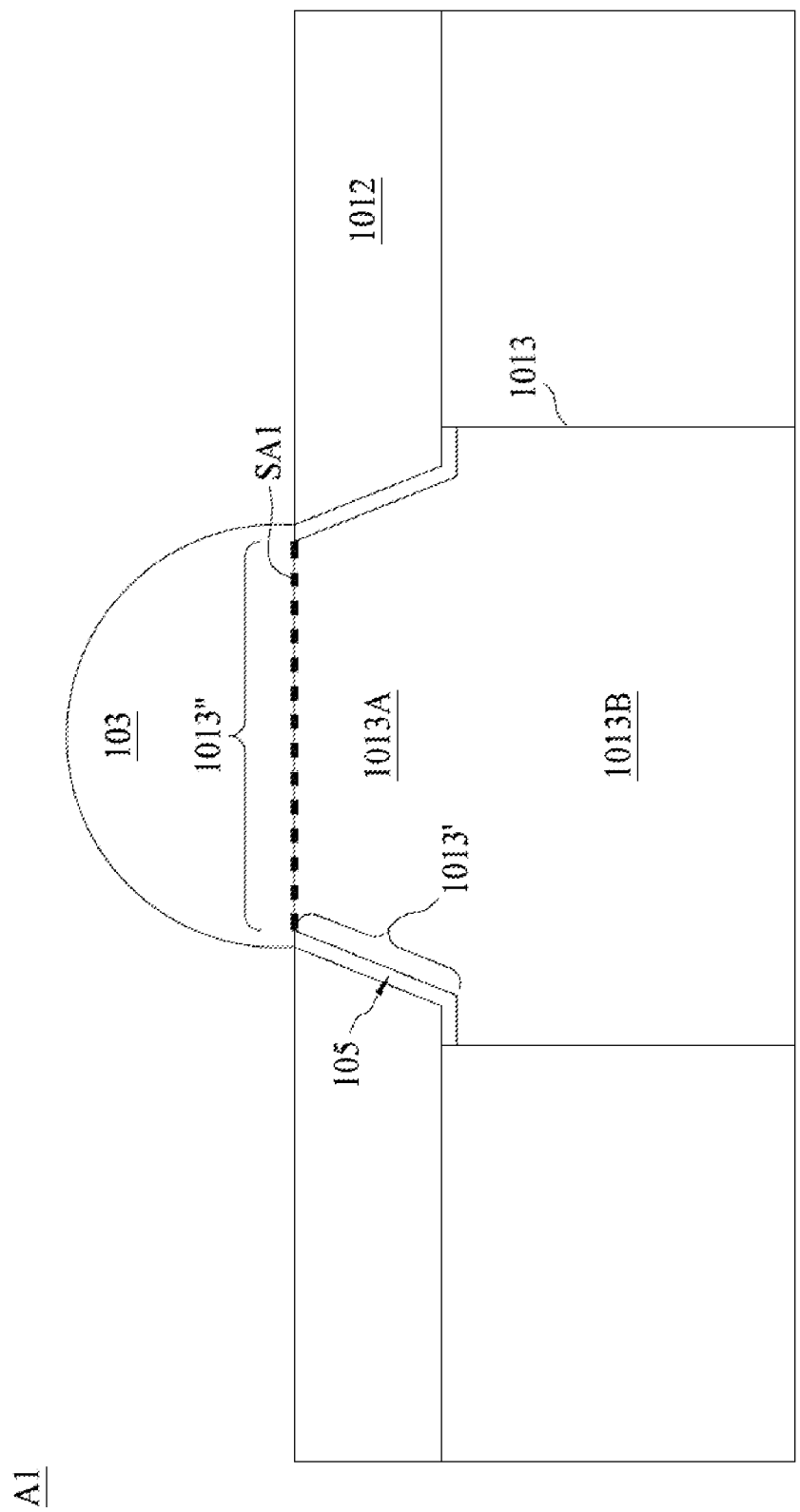
FIG. 2 shows a portional enlarged cross sectional view of a semiconductor package, in accordance with some embodiments of the present disclosure.

Referring to FIG. 2, FIG. 2 is a portional enlarged cross sectional view A1 of the semiconductor package 10, in accordance with some embodiments of the present disclosure. Identical numeral annotations represent identical or similar elements and would not be repeated herein for brevity. The conductive contact 1013 includes a body 1013B and a mesa 1013A. The mesa 1013A has a tapered sidewall 1013' connected with a top surface 1013". As shown in FIG. 2, the top surface 1013" of the mesa 1013A is coplanar with the top surface of the insulating layer 1012. Alternatively stated, sidewall 1013' of the mesa 1013A is completely surrounded by the insulating layer 1012 and the seed layer 105, and only the top surface 1013" of the mesa 1013A is in contact with the solder bump 103. Note the surface area SA1 (shown in dotted lines) of the mesa 1013A connected to the solder bump 103 is smaller than those shown in FIG. 3 and FIG. 4, hence, the solder bump 103 may possess a higher standoff in the final semiconductor package 10 compared to those shown in FIG. 3 and FIG. 4.

FIG. 3 shows a portional enlarged cross sectional view A2 of a semiconductor package 10, in accordance with some embodiments of the present disclosure. The conductive contact 1013 includes a body 1013B and a mesa 1013A. The mesa 1013A has a tapered sidewall 1013' connected with a top surface 1013". As shown in FIG. 3, the top surface 1013" of the mesa 1013A is higher than the top surface of the insulating layer 1012. In FIG. 3, the mesa 1013A protrudes from the insulating layer 1012 by a distance D1. In some embodiments, D1 can be in a range of from about 1 μm to about 7 μm. Alternatively stated, sidewall 1013' of the mesa 1013A is partially surrounded by the insulating layer 1012 and partially surrounded by the seed layer 105, and only the top surface 1013" and a portion of the sidewall 1013' are in contact with the solder bump 103. Note the surface area SA2 (shown in dotted lines) of the mesa 1013A connected to the solder bump 103 is smaller than that shown in FIG. 4 but greater than that shown in FIG. 2, hence, the solder bump 103 may possess a higher standoff in the final semiconductor package 10 compared to that shown in FIG. 4 and a lower standoff in the final semiconductor package 10 compared to that shown in FIG. 2. The greater the surface area of the mesa, the greater the bonding strength between the solder bump 103 and the mesa 1013A.

FIG. 4 shows a portional enlarged cross sectional view A3 of a semiconductor package 10, in accordance with some embodiments of the present disclosure. The conductive contact 1013 includes a body 1013B and a mesa 1013A. The mesa 1013A has a tapered sidewall 1013' connected with a top surface 1013". As shown in FIG. 4, the top surface 1013" of the mesa 1013A is higher than the top surface of the molding compound. In FIG. 4, the mesa 1013A protrudes from the molding compound by a distance D2. In some embodiments, D2 can be in a range of from about 5 μm to about 10 μm. Alternatively stated, sidewall 1013' of the mesa 1013A is neither surrounded by the insulating layer 1012 nor the seed layer 105 shown in previous figures. The top surface 1013" and the sidewall 1013' are in contact with the solder bump 103. Note the surface area SA3 (shown in dotted lines) of the mesa 1013A connected to the solder bump 103 is greater than those shown in FIG. 2 and FIG. 3, hence, the solder bump 103 may possess a lower standoff in the final semiconductor package 10 compared to that shown in FIG. 2 and FIG. 3.

Figure 5:
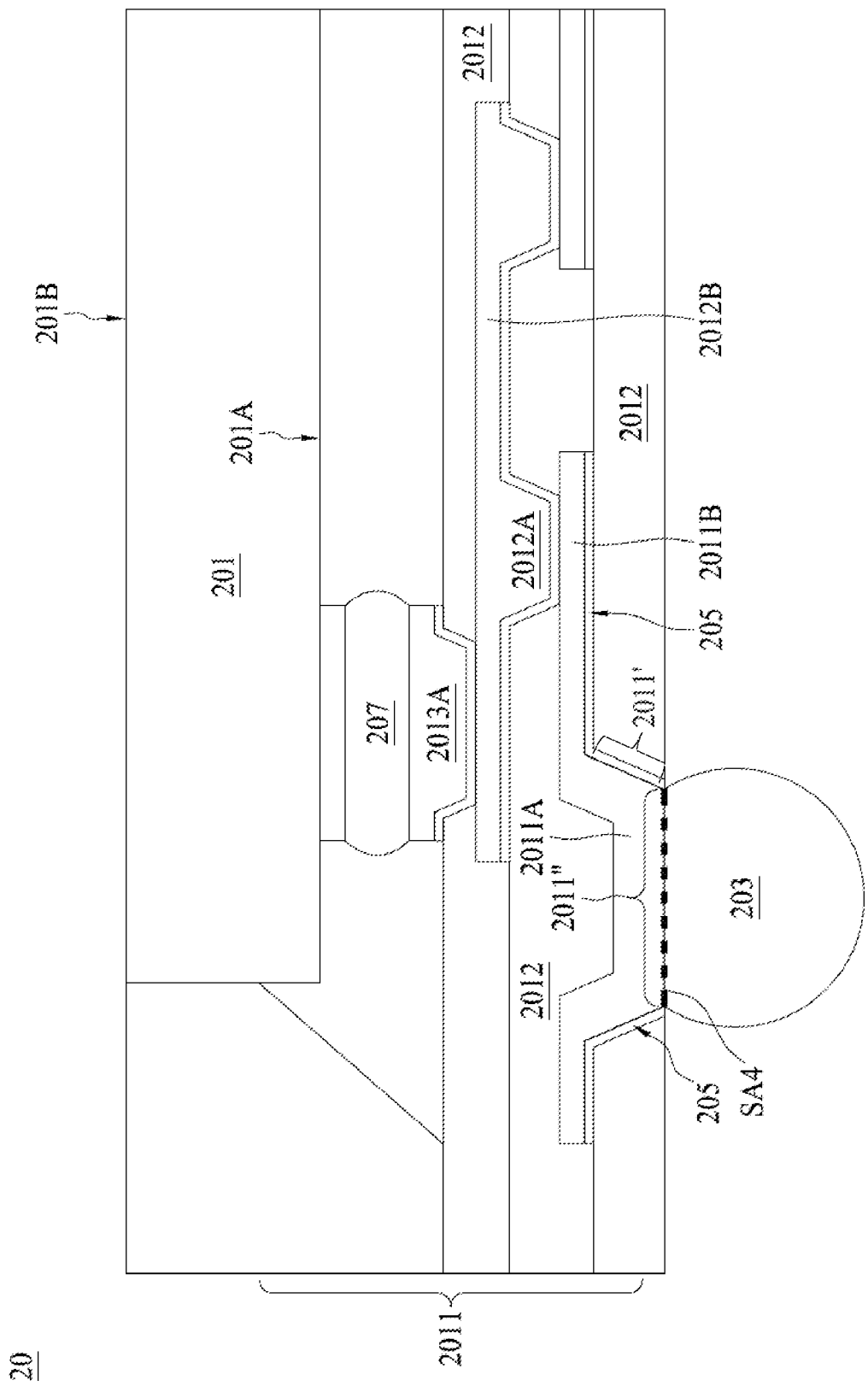
FIG. 5 shows a cross sectional view of a semiconductor package, in accordance with some embodiments of the present disclosure.

FIG. 5 shows a cross sectional view of a semiconductor package 20, in accordance with some embodiments of the present disclosure. The semiconductor package 20 includes a first semiconductor die layer 201 having an active surface 201A and a passive surface 201B. The active surface 201A of the first semiconductor die layer 201 connects to a conductive contact 2011, e.g., an RDL. The conductive contact 2011 is further connected to a solder bump 203. In some embodiments, the solder bump 203 is a C4 bump. The solder bump 203 is closer to the active surface 201A than the passive 201B or back surface of the first semiconductor die layer 201.

In some embodiments, the RDL includes several layers, for example, a first via 2011A/a first line 2011B, a second via 2012A/a second line 2012B, and a third via 2013A. However, more or less layer of an RDL fitting to a particular design is encompassed in the scope of the present disclosure. The RDL is enclosed by an insulating layer 2012. Note the insulating layer 2012 may be formed at different manufacturing operations, as known by people having ordinary skill in the art. In FIG. 5, the first via 2011A has a bottom surface 2011" and a sidewall 2011'. The bottom surface 2011" is exposed from the insulating layer 2012. A seed layer 205 can be observed between the insulating layer 2012 and the sidewall 2011' of the first via 2011A. Apart from the first via 2011A and the insulating layer 2012, seed layer 205 also extends between first line 2011B and the insulating layer 2012.

Figure 6:
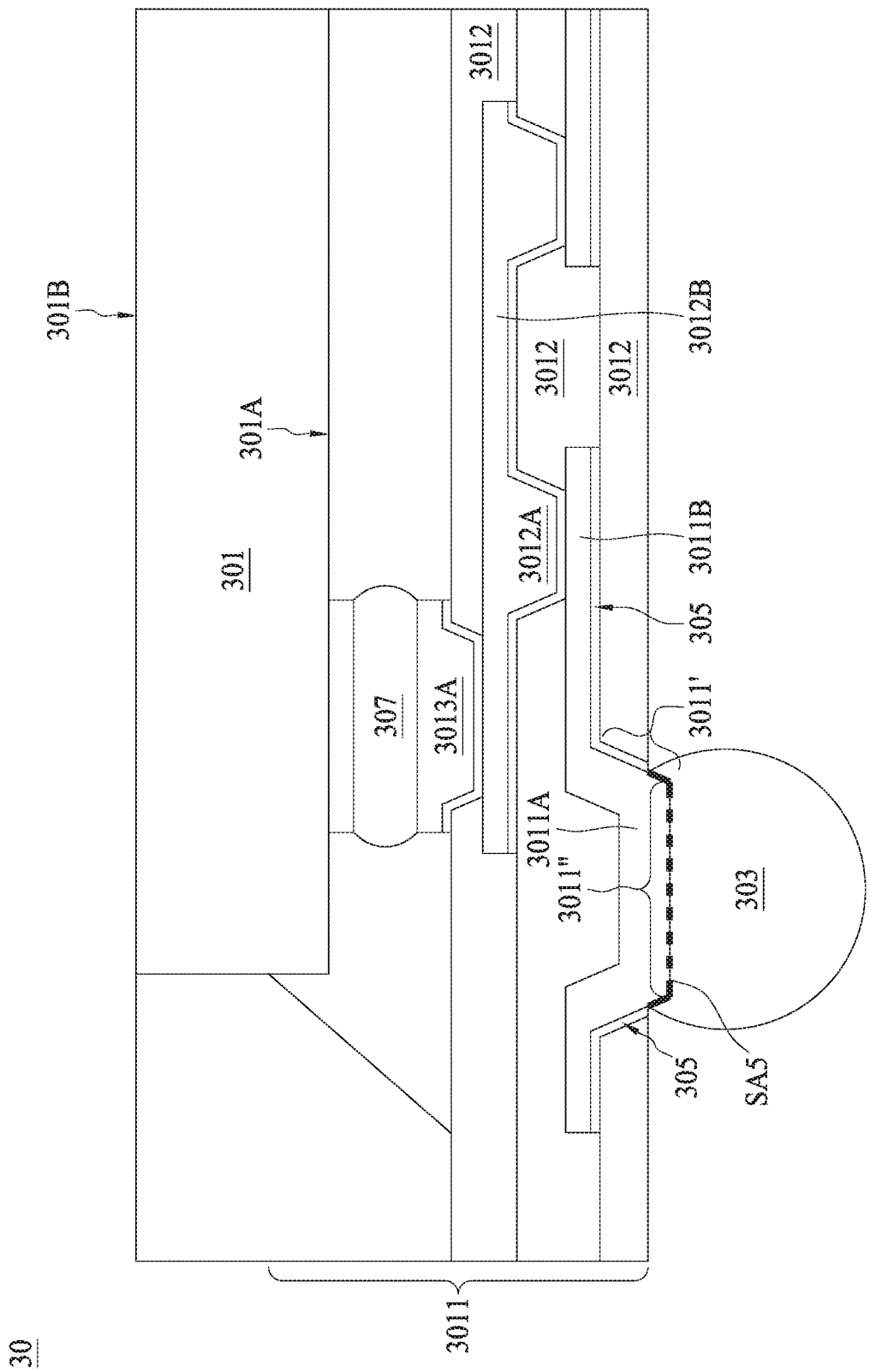
FIG. 6 shows a cross sectional view of a semiconductor package, in accordance with some embodiments of the present disclosure.

Note the surface area SA4 of the first via 2011A connected to the solder bump 203 is smaller than the surface area SA5 shown in FIG. 6, hence, the solder bump 203 may possess a higher standoff in the final semiconductor package 20 compared to those in the final semiconductor package 30 of FIG. 6.

FIG. 6 shows a cross sectional view of a semiconductor package 30, in accordance with some embodiments of the present disclosure. The semiconductor package 30 includes a first semiconductor die layer 301 having an active surface 301A and a passive surface 301B. The active surface 301A of the first semiconductor die layer 301 connects to a conductive contact 3011, e.g., an RDL. The conductive contact 3011 is further connected to a solder bump 303. In some embodiments, the solder bump 303 is a C4 bump. The solder bump 303 is closer to the active surface 301A than the passive 301B or back surface of the first semiconductor die layer 301.

In some embodiments, the RDL includes several layers, for example, a first via 3011A/a first line 3011B, a second via 3012A/a second line 3012B, and a third via 3013A. However, more or less layer of an RDL fitting to a particular design is encompassed in the scope of the present disclosure. The RDL is enclosed by an insulating layer 3012. In FIG. 6, the first via 4011A has a bottom surface 3011" and a sidewall 3011'. The bottom surface 3011" is exposed from the insulating layer 3012 and the sidewall 3011' is partially exposed from the insulating layer 3012. A seed layer 305 can be observed between the insulating layer 3012 and a portion of the sidewall 3011' of the first via 3011A. Apart from the first via 3011A and the insulating layer 3012, seed layer 305 also extends between first line 3011B and the insulating layer 3012.

Note the surface area SA5 of the first via 3011A connected to the solder bump 303 is greater than the surface area SA4 shown in FIG. 5, hence, the solder bump 303 may possess a lower standoff in the final semiconductor package 30 compared to those in the final semiconductor package 20 of FIG. 5.

Figure 7A:
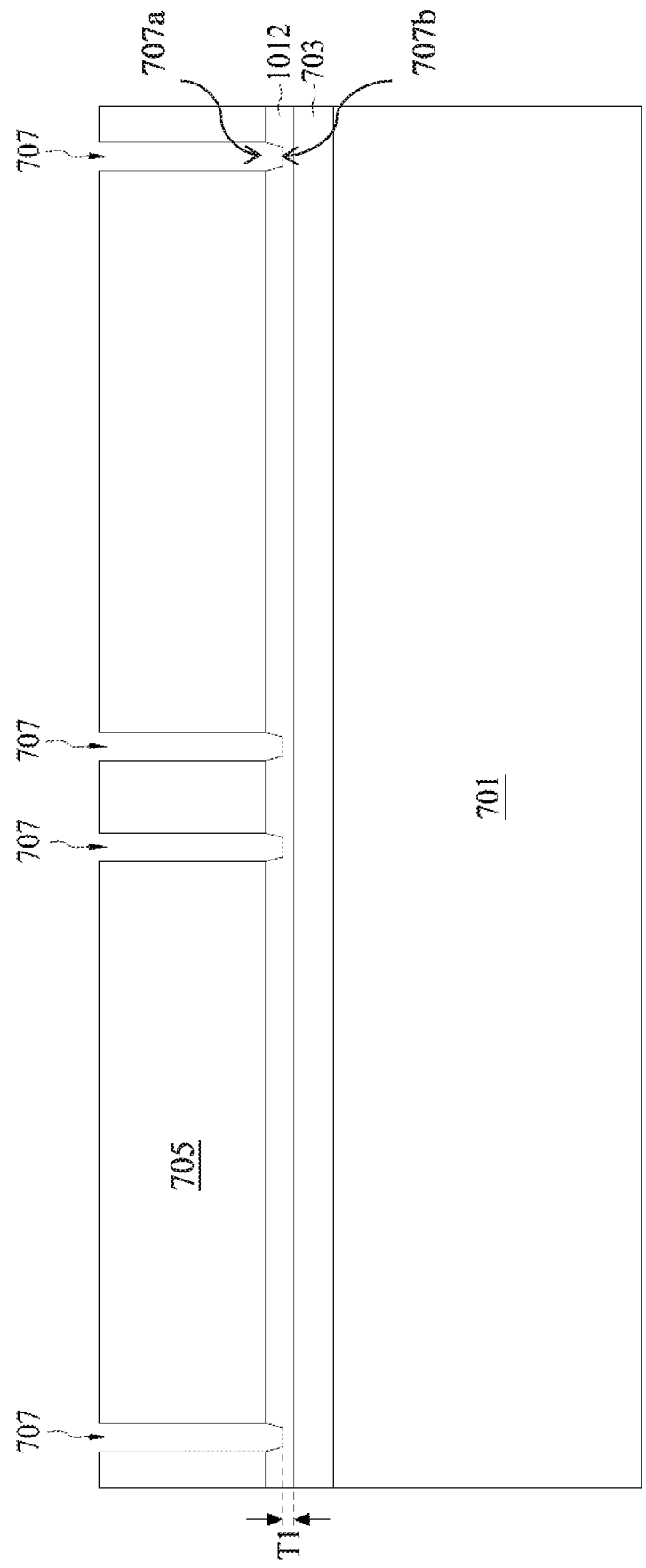
FIG. 7A to FIG. 7H show cross sectional views of a sequence of a method for manufacturing a semiconductor package, in accordance with some embodiments of the present disclosure.

FIG. 7A to FIG. 7H show cross sectional views of a sequence of a method for manufacturing a semiconductor package 10, in accordance with some embodiments of the present disclosure. Identical numeral annotations represent identical or similar elements and would not be repeated herein for brevity. In FIG. 7A, a carrier 701 is provided with a gluing layer 703. An insulating layer 1012 or a dielectric layer is subsequently formed over the gluing layer 703. The insulating layer 1012 may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD).

A photoresist 705 is deposited and patterned over the insulating layer 1012 such as by acceptable photolithography techniques. An etch operation is carried out to form a trench 707 with an open end 707a and a closed end 707b pattern in the insulating layer 1012. In some embodiments, the trench 707 is a recess occupying a portion of the thickness of the insulating layer 1012 and not penetrating through the insulating layer 1012. In some embodiments, the remaining thickness T1 of the insulating layer 1012 under the trench 707 is about 2 micrometer. Alternatively stated, a difference between thickness T1 and the thickness of the original insulating layer 1012 is the height of the mesa 1013A shown in FIG. 2 to FIG. 4. The thickness T1 is determined to be about 2 micrometer because longer backside etching time is required if thicker than T1 and damages may be caused to the gluing layer during trench 707 formation if thinner than T1.

Figure 7B:
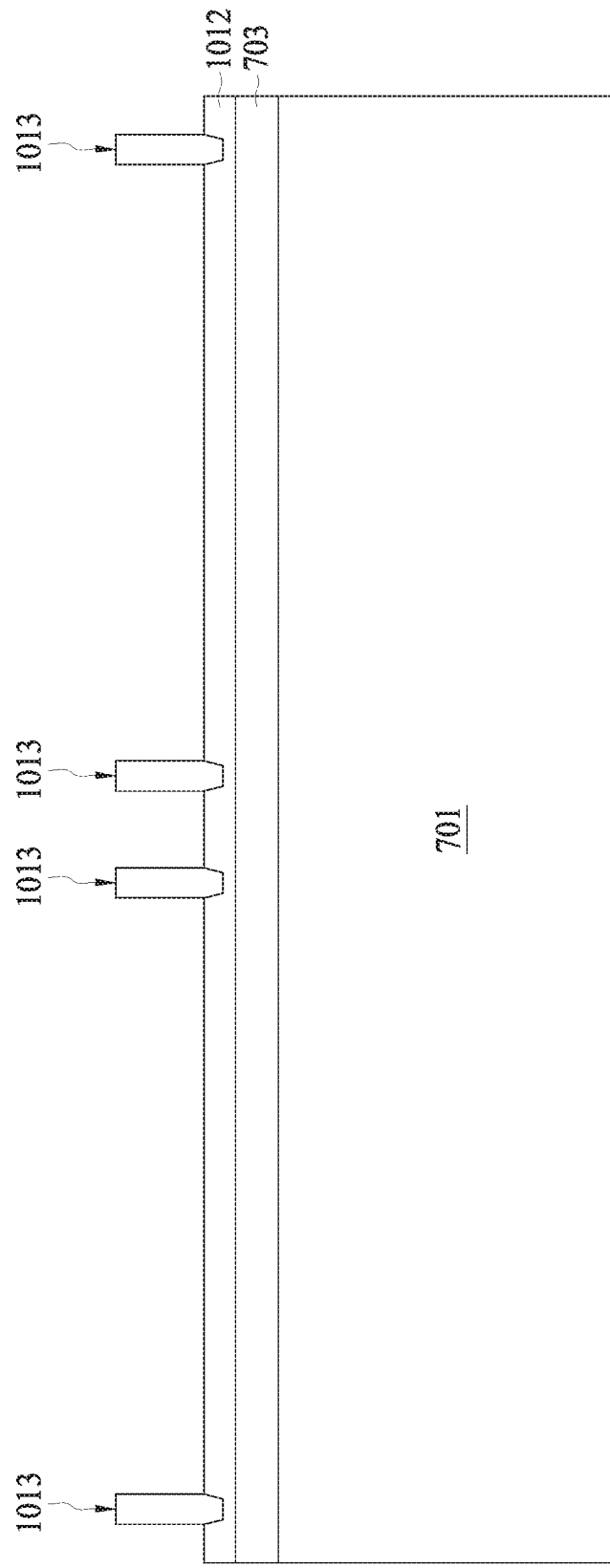

In FIG. 7B, a conductive contact 1013 is formed in the trench 707 with the closed end 707b by, for example, an electroplating operation. A seed layer is deposited in the openings of patterned photoresist. The seed layer (not shown) deposited over the insulating layer 1012 and the trench 707 can be copper, titanium, the like, or a combination thereof, and can be deposited by sputtering, another PVD process, the like, or a combination thereof. A conductive material, such as copper, aluminum, the like, or a combination thereof, is deposited in the trench 707 by electroless plating, electroplating, or the like. The photoresist 705 is removed, such as by an ash and/or flush process.

Figure 7C:
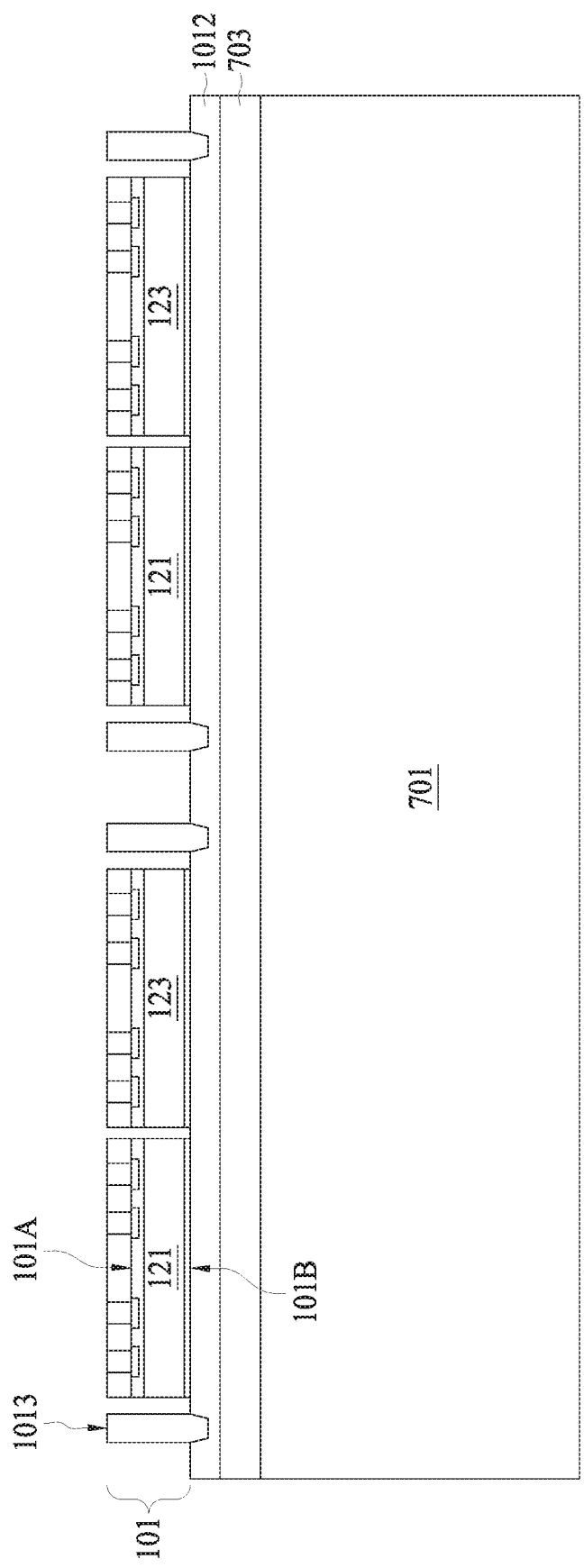
Figure 7D:
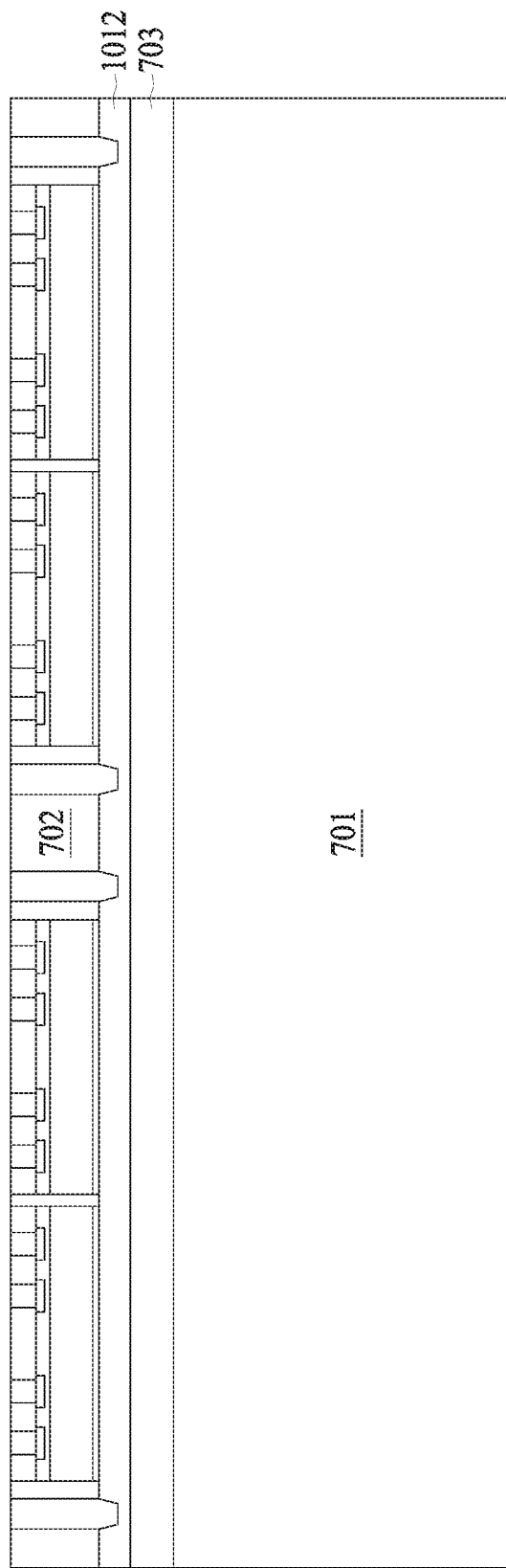

In FIG. 7C, dies 121, 123 of the first semiconductor die layer 101 is place over the insulating layer 1012. In some embodiments, dies 121, 123 can be known good dies (KGD) determined by a testing or probing operation. The KGD is attached using a pick-and-place tool. In some embodiments, the passive surface 101B or the back surface of the dies 121, 123 are in contact with the insulating layer 1012. The active surface 101A is facing the direction opposite to the carrier 701. In FIG. 7D, a molding compound 702 is applied over the conductive contacts 1013 and the dies 121, 123. A planarization operation is followed to at least expose the active surface 101A of the dies 121, 123 and the end portion of the conductive contact 1013 in order to expose the metallization portion for subsequent operations.

Figure 7E:
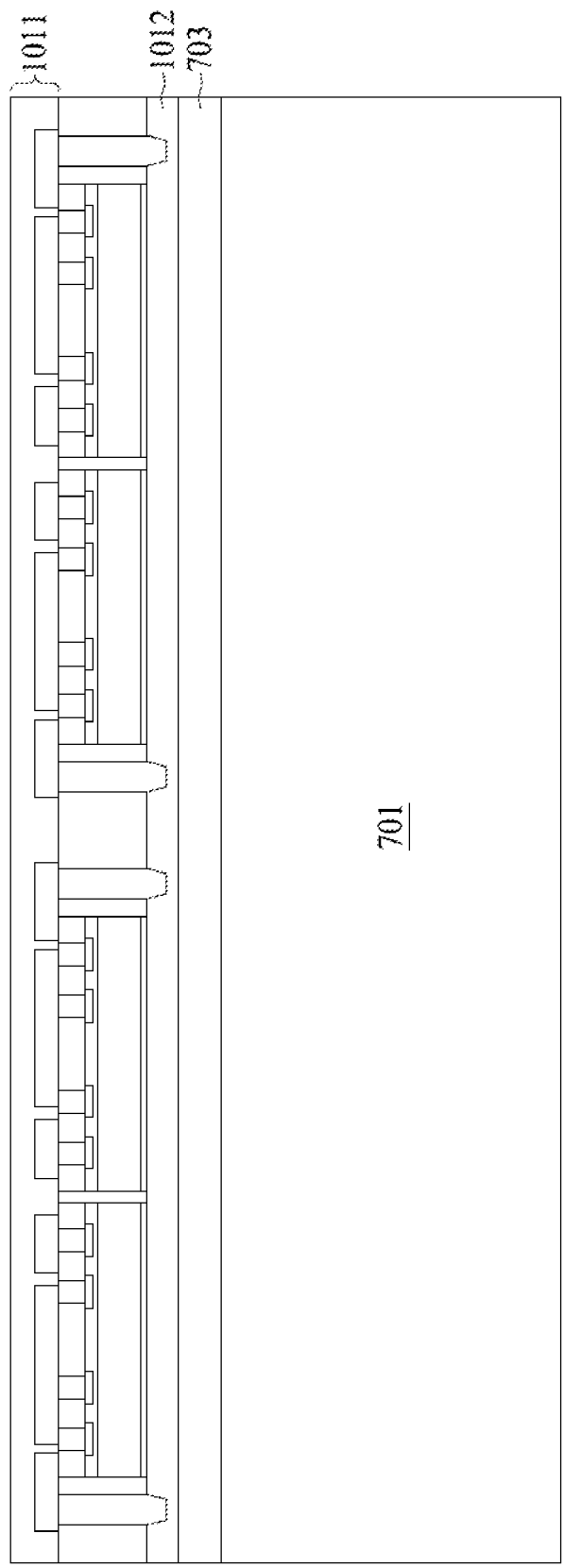
Figure 7F:
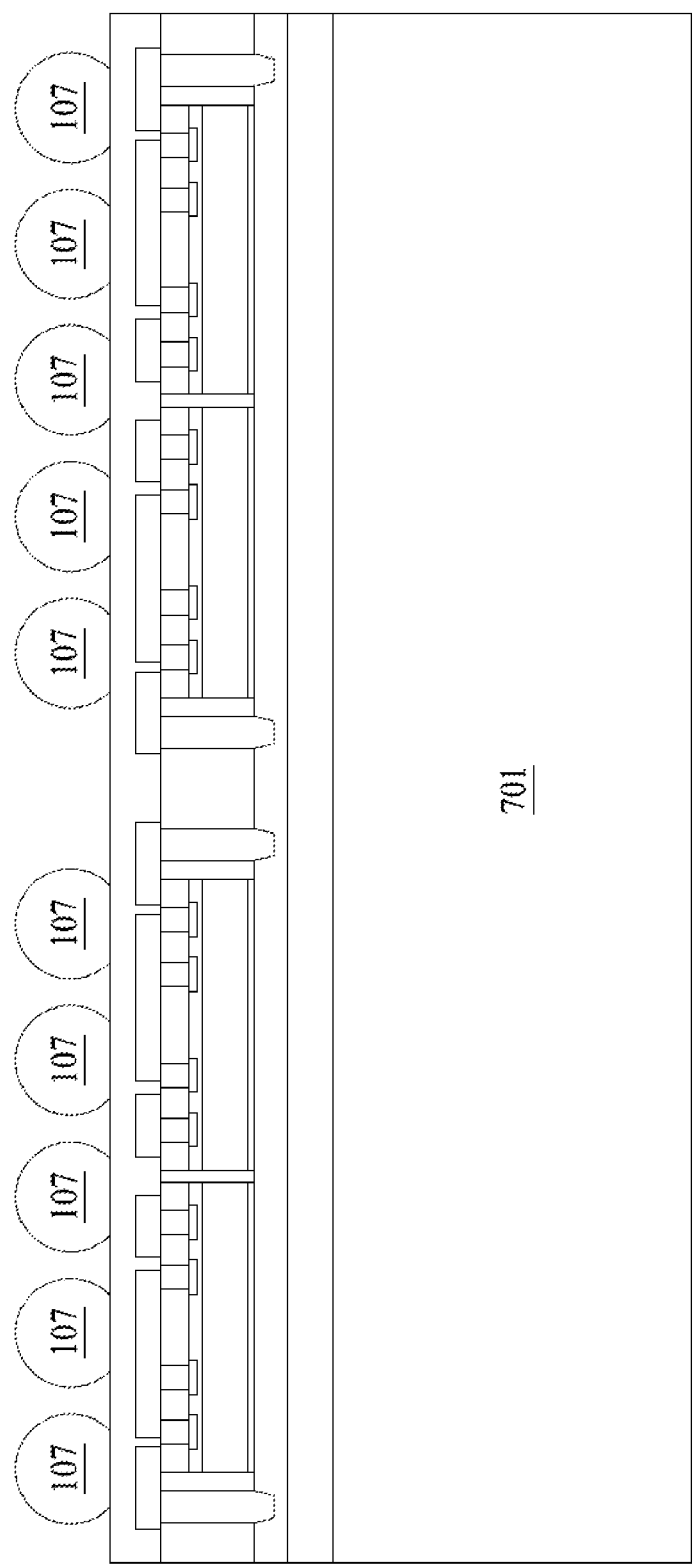
Figure 7G:
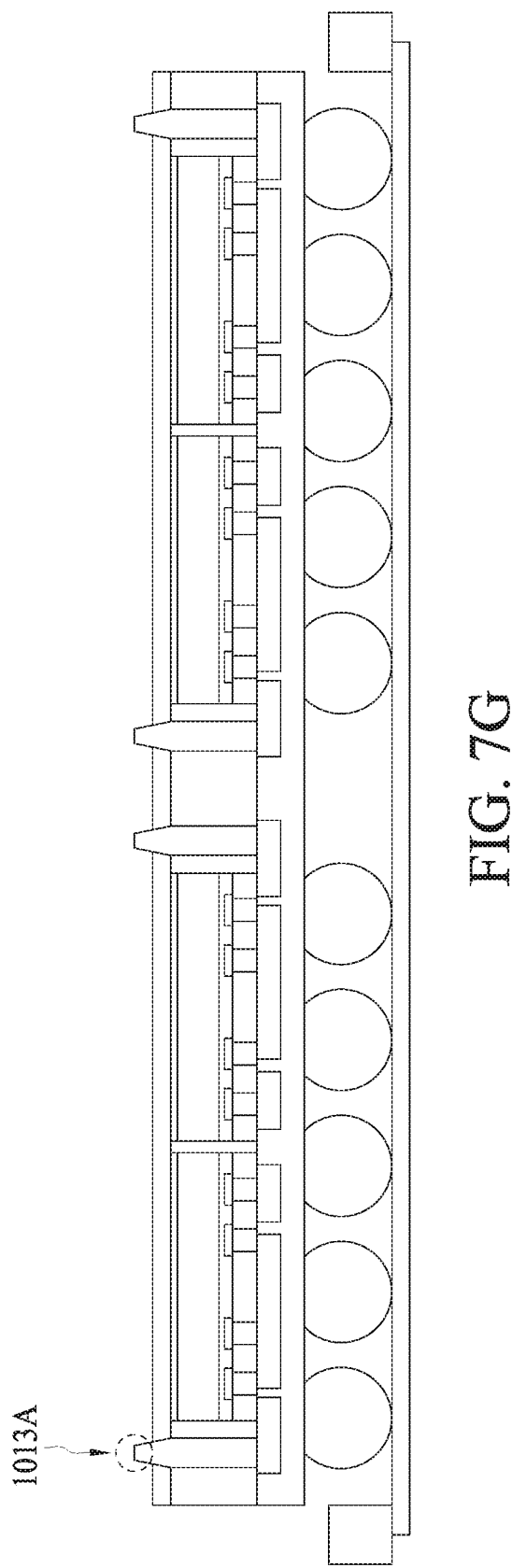

In FIG. 7E, an RDL 1011 is formed over the planarized surface of the molding compound 702 and being electrically connected to the dies 121, 123 and conductive contacts 1013. In FIG. 7F, the RDL 1011 is further processed to form electrical connection with a BGA 107. In some embodiments, an integrated passive device (IPD) is also placed at the same level of the BGA 107 and coupled with the RDL 1011. In FIG. G, the carrier 701 is debonded from the first semiconductor die layer 101, specifically, the carrier 701 is separated from the insulating layer by the property change of the gluing layer 703. The de-bonding may comprise exposing the gluing layer 703 to UV lights, such as a laser, or by exposing the adhesive to a solvent. The carrier 701 may comprise, for example, glass, silicon oxide, aluminum oxide, a combination thereof. The gluing layer 703 may be any suitable adhesive, such as UV glue, which loses its adhesive property when exposed to UV lights.

After the separation of the carrier 701 and the gluing layer 703, the insulating layer 1012 is exposed as a result. Referring back to FIG. 7A, due to the fact that a thickness T1 of the insulating layer 1012 is preserved when forming the closed-end trench 707, the conductive contact 1013 is not exposed immediately after the debonding operation discussed above. A subsequent and separate etching operation is carried out to consume at least the thickness T1 of the insulating layer 1012 in order to expose at least the top surface of the 1013" of the mesa 1013A, as shown from FIG. 2 to FIG. 4. The etching operation can be any dry etch operation that is suitable in controlling the extent of etching depth. For example, a plasma etch can be applied to the insulating layer 1012 with a first plasma energy for etching to expose the top surface 1013" of the mesa 1013A and obtain a structure as depicted in FIG. 2. In other embodiment, a second plasma energy can be applied to expose both the top surface 1013" and a portion of the sidewall 1013' of the mesa 1013A in order to obtain a structure as depicted in FIG. 3. For another embodiment, a third plasma energy can be adopted to expose both the top surface 1013" and the complete sidewall 1013' of the mesa 1013A in order to obtain a structure as depicted in FIG. 4. In some embodiments, the dry etching not only removes materials of the insulating layer 1012 but also a portion of the seed layer (not shown) deposited prior to the formation of the conductive contact 1013. Using dry etch to expose the conductive contact instead of using laser drilling can render smaller critical dimension of the conductive contact, a better overlay control, a high manufacturing through-put, and the counts of the conductive contact being irrelevant to the fabrication cost. Dry etching leverages a sophisticated etching technology in one manufacturing operation instead of a series of drilling operations.

Figure 7H:
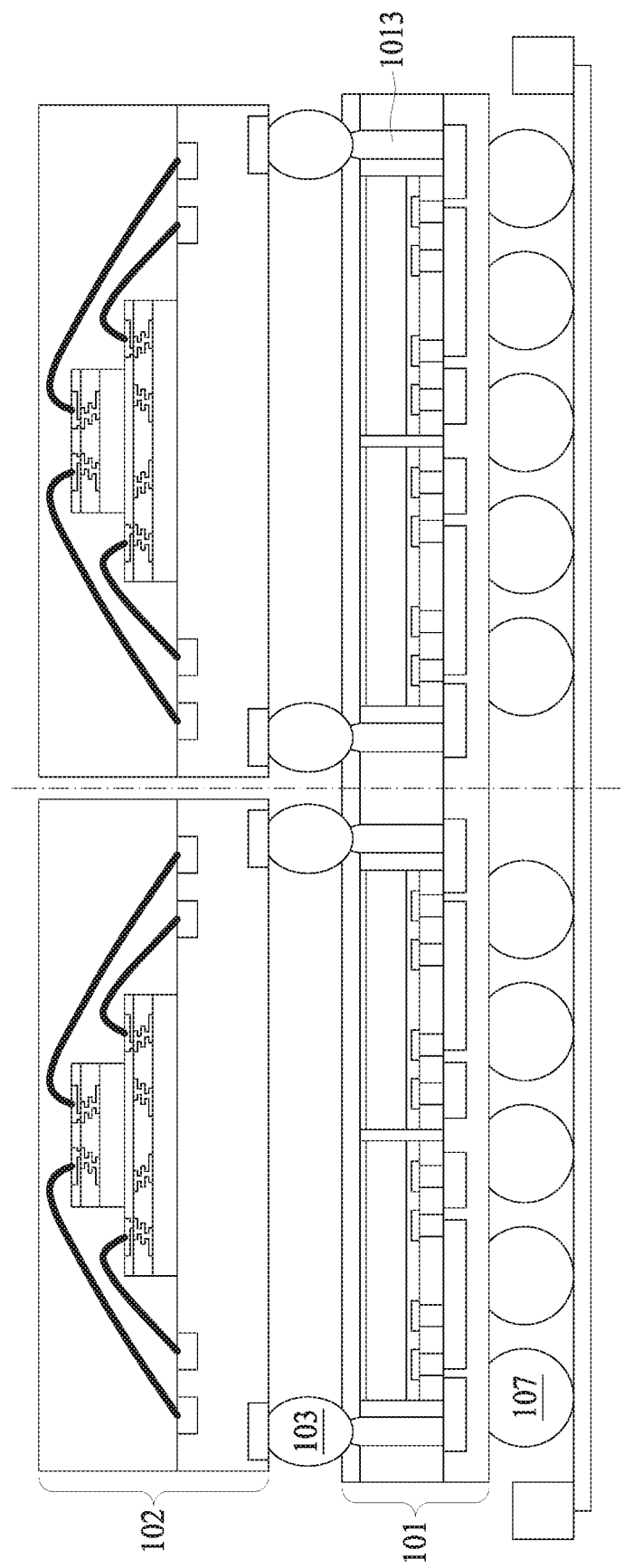

In FIG. 7H, second semiconductor die layer 102 is pre-formed to have a solder bump 103 connected thereto, and the second semiconductor die layer 102 is coupled to the exposed conductive contact 1013 through the solder bump 103. Details of the interface between the conductive contact 1013 and the solder bump 103 can be referred to FIG. 2, FIG. 3, and FIG. 4 of the present disclosure.

Figure 8A:
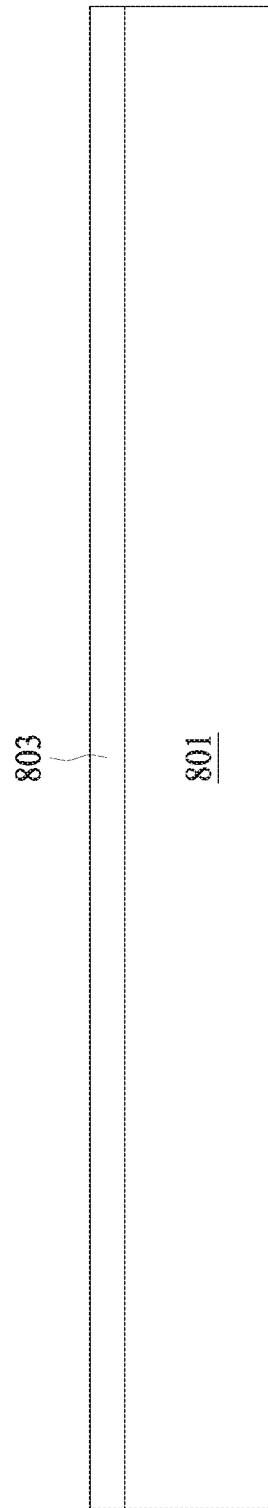
Figure 8B:
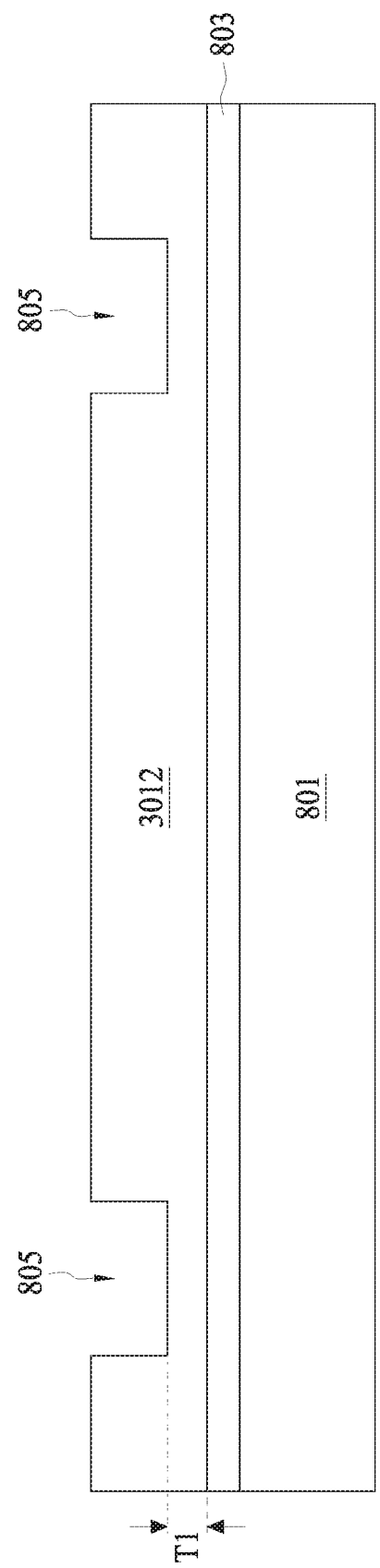

Referring to FIG. 8A to FIG. 8H, FIG. 8A to FIG. 8H show cross sectional views of a sequence of a method for manufacturing a semiconductor package 30, in accordance with some embodiments of the present disclosure. In FIG. 8A, a carrier 801 is provided with a gluing layer 803. In FIG.

8B, an insulating layer 3012 or a first interlayer dielectric (ILD) is subsequently formed over the gluing layer 803. The insulating layer 3012 may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Also shown in FIG. 8B, a photolithography operation is carried out to form a trench 805 with a closed end. In some embodiments, the remaining thickness T1 of the insulating layer 3012 under the trench 805 is about 2 micrometer.

Figure 8D:
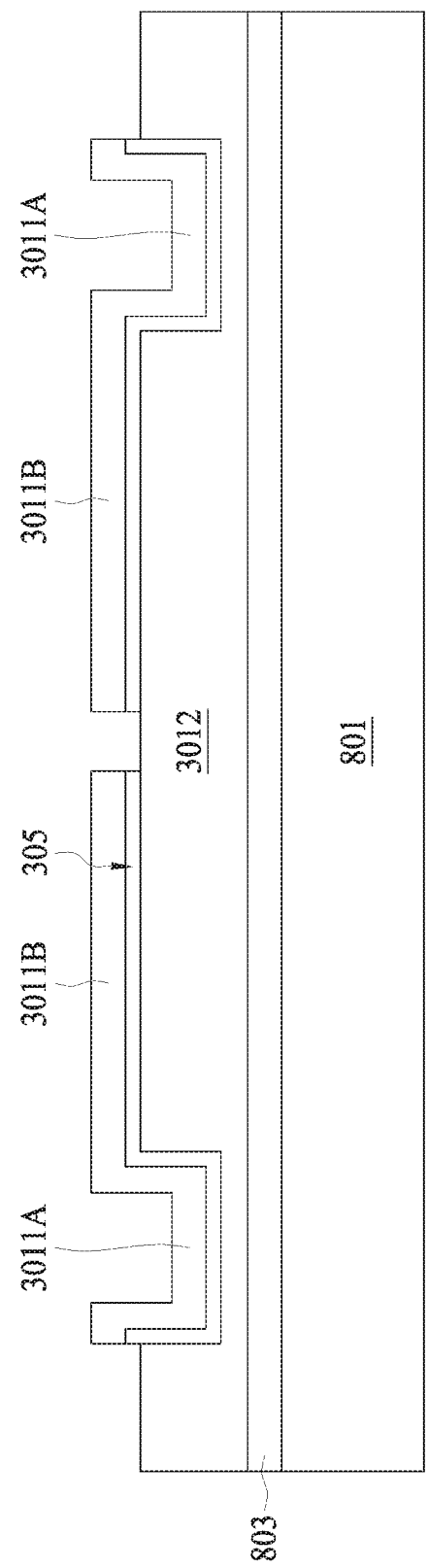

In FIG. 8C, a seed layer 305 is deposited over the insulating layer 3012 and a patterned photoresist 807 is further formed over the seed layer 305. The seed layer, such as a copper, titanium, or the like, is deposited on the insulating layer 3012, such as by sputtering or another physical vapor deposition (PVD) process. In FIG. 8D, a first RDL is formed by an electroplating operation, and the patterned photoresist 807 is removed. The first RDL includes a first via 3011A complying the trench of the insulating layer 3012 and a first line 3011B at the top surface of the insulating layer 3012. Note the removal of the patterned photoresist 807 may also remove the underlying seed layer 305.

Figure 8E:
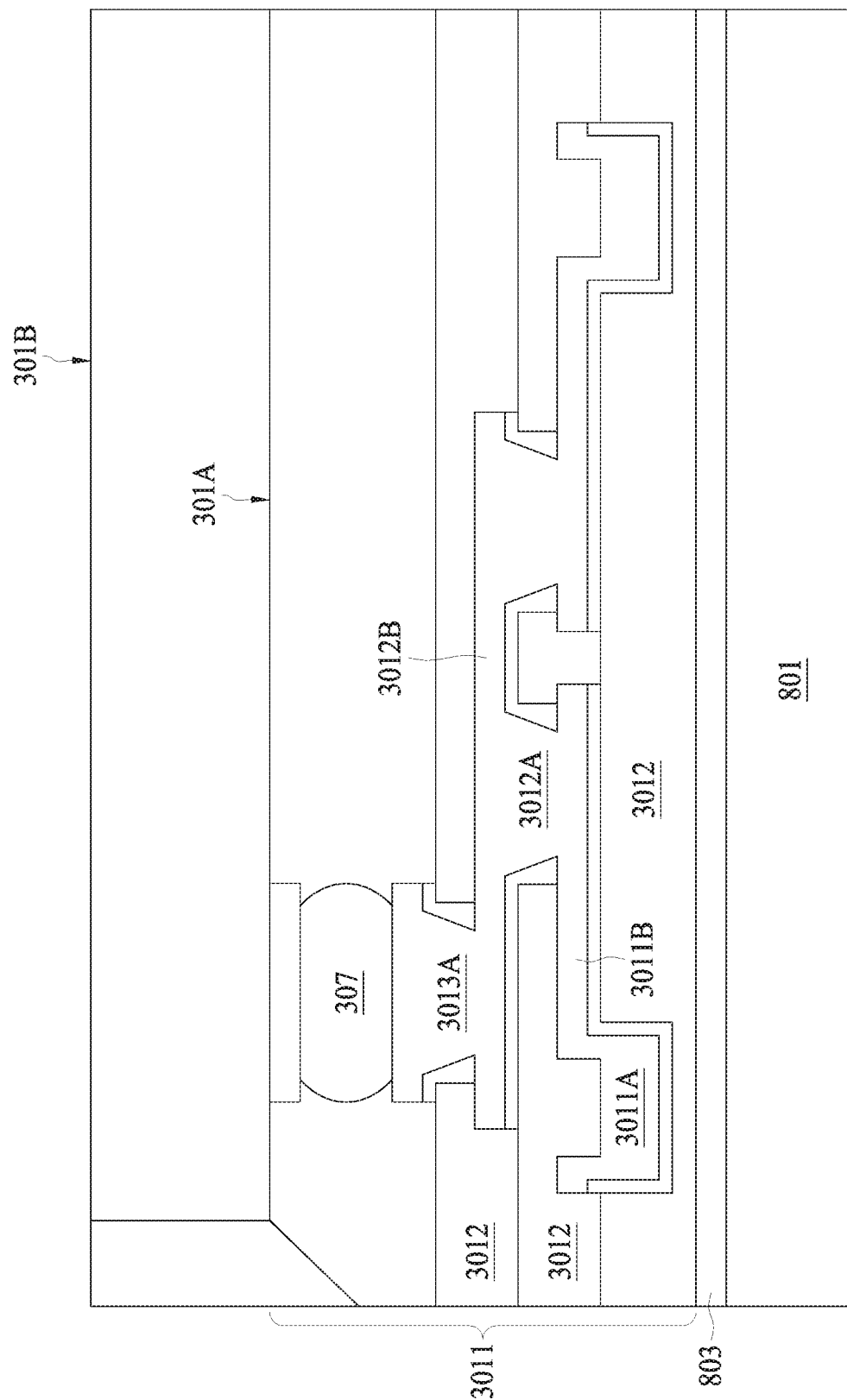

In FIG. 8E, another insulating layer 3012 is formed over the first RDL. A second ILD is deposited over the first RDL. The second ILD may be a polyimide, polybenzoxazole (PBO), benzocyclobutene (BCB), the like, or a combination thereof. The second ILD can be deposited by a coating process, a lamination process, the like, or a combination thereof. Openings may be formed through the second ILD layer to the first RDL layer using acceptable photolithography techniques. Subsequent second RDL may be formed using the same or similar processes as discussed with regard to the first RDL. The second RDL includes a second via 3012A complying an opening of the second ILD and a second line 3012B at the top surface of the second ILD. Subsequently, another insulating layer 3012 is formed over the second RDL, particularly, a third ILD is deposited over the second RDL and a third via 3013A is formed in an opening of the third ILD. The number of the RDL can be determined according to different designs and is not a limiting demonstration herein.

Figure 8F:
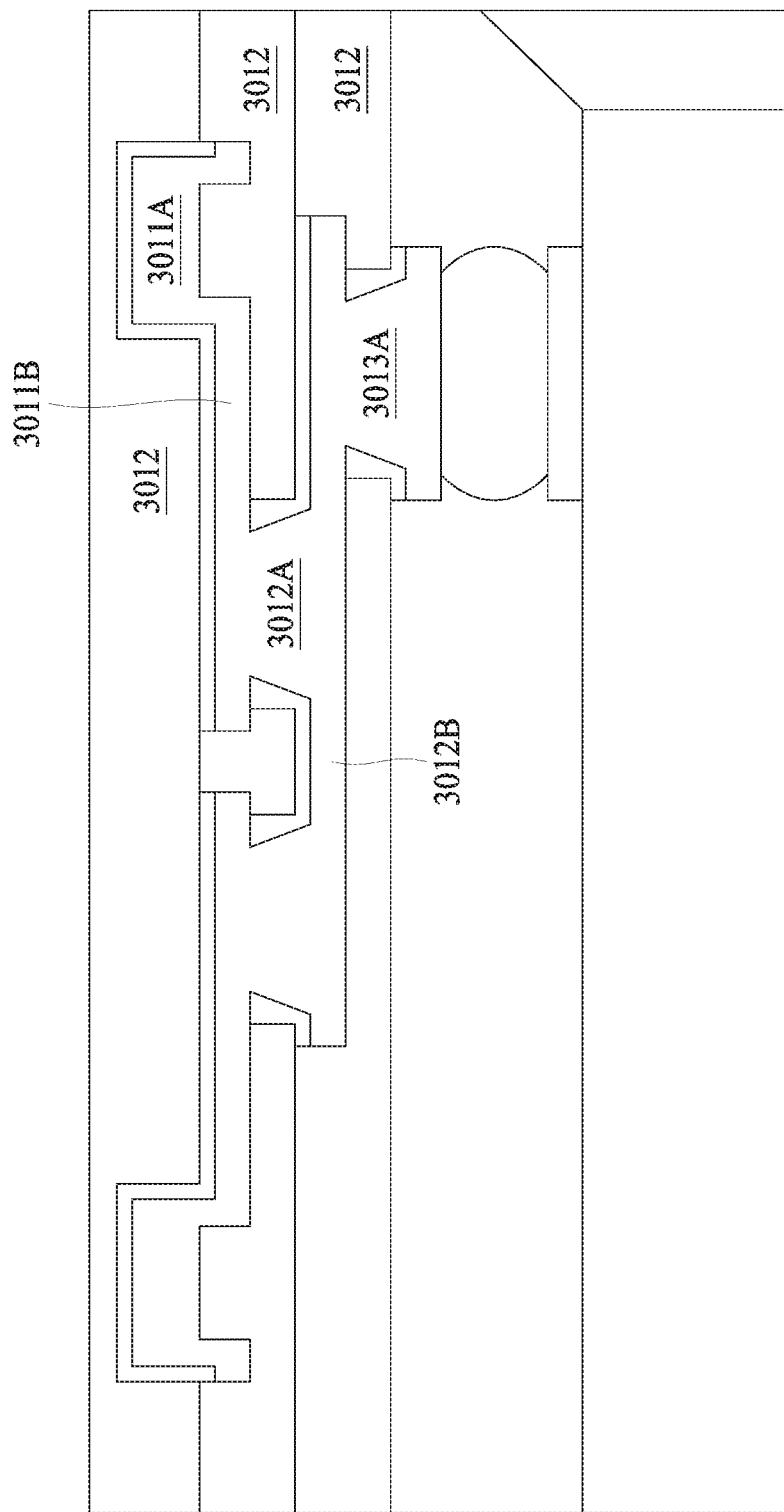

A first semiconductor die layer 301 is formed over the RDL further away from the carrier 801 and electrically coupled to said RDL through a solder bump 307. An active surface 301A of the first semiconductor die layer 301 is facing layer of the RDL away from the carrier 801. In FIG. 8F, the carrier 801 is debonded from the RDL, specifically the carrier 801 is separated from the insulating layer 3012 by the property change of the gluing layer 803. The de-bonding may comprise exposing the gluing layer 803 to UV lights, such as a laser, or by exposing the adhesive to a solvent. The carrier 801 may comprise, for example, glass, silicon oxide, aluminum oxide, a combination thereof. The gluing layer 803 may be any suitable adhesive, such as UV glue, which loses its adhesive property when exposed to UV lights.

After the separation of the carrier 801 and the gluing layer 803, the insulating layer 3012 is exposed as a result. Referring back to FIG. 8B, due to the fact that a thickness T1 of the insulating layer 3012 is preserved when forming the closed-end trench 805, the conductive contact or the first via 3011A of the first RDL is not exposed immediately after the debonding operation discussed above. A subsequent and separate etching operation is carried out to consume at least the thickness T1 of the insulating layer 3012 in order to expose at least the top surface of the 1013" of the mesa 1013A, as shown from FIG. 2 to FIG. 4. The etching operation can be any dry etch operation that is suitable in controlling the extent of etching depth. For example, a plasma etch can be applied to the insulating layer 3012 with a first plasma energy for etching to expose the top surface 1013" of the mesa 1013A and obtain a structure as depicted in FIG. 2. In other embodiments, a second plasma energy can be applied to expose both the top surface 1013" and a portion of the sidewall 1013' of the mesa 1013A in order to obtain a structure as depicted in FIG. 3. For another embodiment, a third plasma energy can be adopted to expose both the top surface 1013" and the complete sidewall 1013' of the mesa 1013A in order to obtain a structure as depicted in FIG. 4. In some embodiments, the dry etching not only removes materials of the insulating layer 3012 but also a portion of the seed layer (not shown) deposited prior to the formation of the conductive contact or the first via 3011A. Using dry etch to expose the conductive contact instead of using laser drilling can render smaller critical dimension of the conductive contact, a better overlay control, a high manufacturing through-put, and the counts of the conductive contact being irrelevant to the fabrication cost. Dry etching leverages a sophisticated etching technology in one manufacturing operation instead of a series of drilling operations.

Figure 8G:
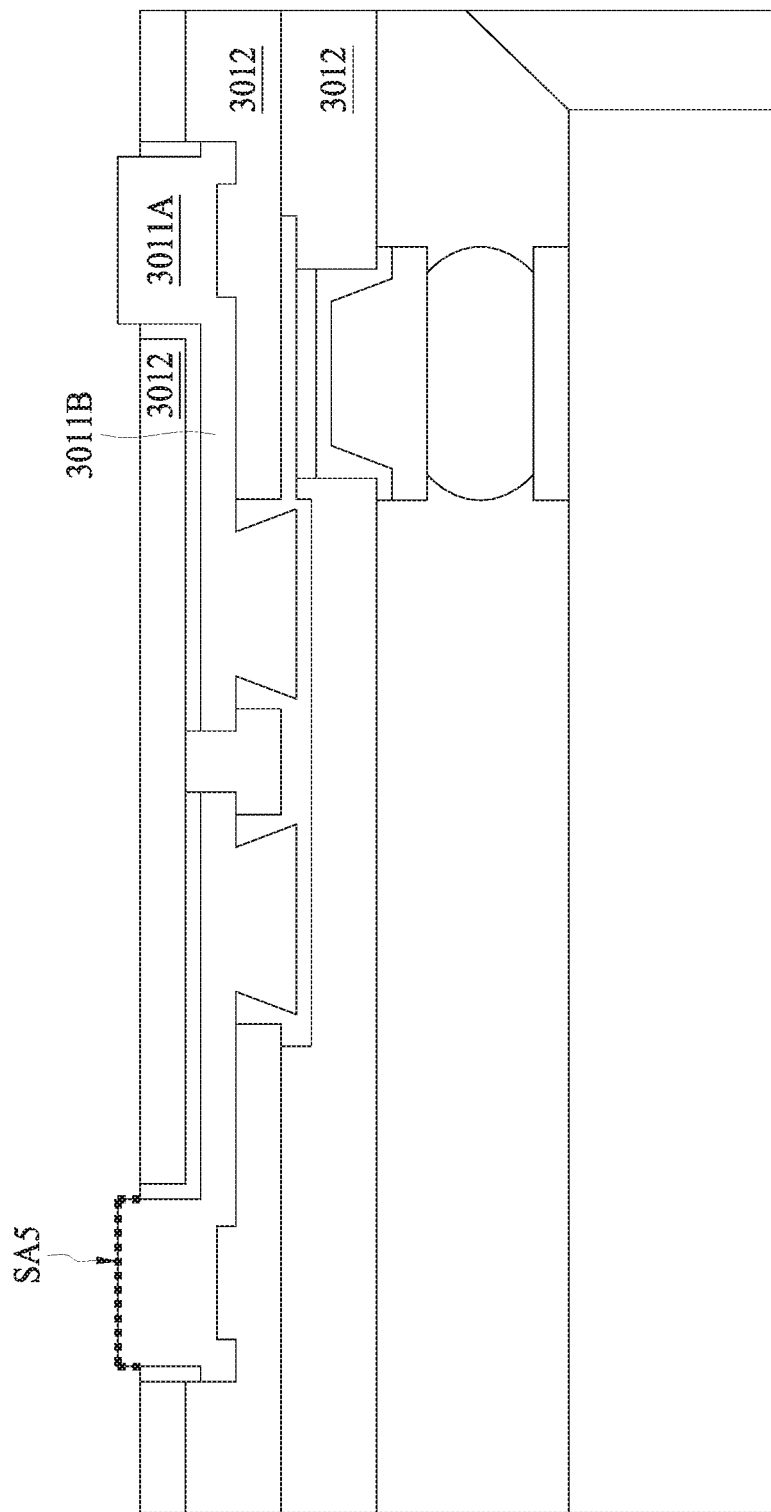

For example, as shown in FIG. 8G, a top surface and a portion of the sidewall of the conductive contact or the first via 3011A protrude from the insulating layer 3012 as a result of the dry etch operation. A surface area SA5 of the first via 3011A is previously discussed in FIG. 3 and can be referred thereto. In FIG. 8H, a solder bump 303 is further mounted to the exposed surface of the first via 3011A. The solder bump 303 is in contact with the surface area SA5 of the first via 3011A.

Some embodiments of the present disclosure provide a semiconductor package. The semiconductor package includes a first semiconductor die layer having an active surface, a conductive contact electrically coupled to the active surface, a sidewall of the conductive contact being surrounded by an insulating layer; and a solder bump connected to the conductive contact. A seed layer is between the sidewall of the conductive contact and the insulating layer.

Some embodiments of the present disclosure provide a method for manufacturing a semiconductor package. The method includes providing a carrier, forming an insulating layer over the carrier, forming a first semiconductor die layer over the insulating layer, debonding the carrier from the insulating layer, and exposing the conductive contact from the insulating layer by an etching operation. The forming a first semiconductor die layer over the insulating layer further includes forming a shallow trench in the insulating layer, forming a conductive contact in the shallow trench, and placing first semiconductor die over the insulating layer.

Some embodiments of the present disclosure provide a method for manufacturing a semiconductor package. The method includes providing a carrier, forming a first semiconductor die layer over the carrier, debonding the carrier from the first polymer layer, and exposing the conductive contact from the first polymer layer by an etching operation. The forming a first semiconductor die layer over the carrier includes forming a first polymer layer over the carrier, forming a shallow trench in the first polymer layer, forming a conductive contact in the shallow trench, and placing first semiconductor die over the first polymer layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor package, comprising:
   providing a carrier;
   forming an insulating layer over the carrier;
   forming a first semiconductor die layer over the insulating layer, comprising:
      forming a shallow trench in the insulating layer;
      forming a conductive contact in the shallow trench; and
      placing the first semiconductor die over the insulating layer; and
   exposing the conductive contact from the insulating layer by evenly thinning down the insulating layer in an etching operation.

2. The method of claim 1, further comprising debonding the carrier from the insulating layer prior to exposing the conductive contact.

3. The method of claim 1, wherein the forming the shallow trench in the insulating layer comprises patterning a photomask over the insulating layer and forming the shallow trench with a closed end in the insulating layer.

4. The method of claim 1, wherein the forming the conductive contact in the shallow trench further comprises forming a seed layer in the closed end of the shallow trench.

5. The method of claim 1, subsequent to forming a shallow trench in the insulating layer, a thinnest portion of the insulating layer is about 2 micrometer.

6. The method of claim 4, wherein the etching operation comprises removing a portion of the seed layer.

7. The method of claim 1, wherein placing the first semiconductor die comprises placing known good die over the insulating layer.

8. A method for manufacturing a semiconductor package, comprising:
   providing a carrier;
   forming a first semiconductor die layer over the carrier, comprising:
      forming a first polymer layer over the carrier;
      forming a shallow trench in the first polymer layer;
      forming a conductive contact in the shallow trench; and
      placing the first semiconductor die over the first polymer layer; and
   exposing the conductive contact from the first polymer layer by evenly thinning down the first polymer layer in an etching operation.

9. The method of claim 8, further comprising debonding the carrier from the first polymer layer prior to exposing the conductive contact.

10. The method of claim 8, wherein the first polymer layer and the conductive contact are a portion of a first redistribution layer (RDL).

11. The method of claim 8, wherein the forming the conductive contact in the shallow trench further comprises forming a seed layer in the shallow trench.

12. The method of claim 8, wherein forming the conductive contact in the shallow trench is performed concurrently with forming a RDL over the first polymer layer.

13. The method of claim 8, further comprising forming a second RDL over the first RDL.

14. The method of claim 8, wherein the etching operation comprises a dry etch operation.

15. A method for manufacturing a semiconductor package, comprising:
   providing a carrier;
   forming a semiconductor die layer over the carrier, comprising:
      forming an insulating layer over the carrier;
      forming a trench having a closed end and an open end in the insulating layer;
      forming a conductive contact in the trench; and
   placing a semiconductor die over the insulating layer; and
   exposing the conductive contact from the closed end of the trench in the insulating layer by evenly thinning down the insulating layer in an etching operation.

16. The method of claim 15, wherein forming the trench having the closed end and the open end in the insulating layer comprises patterning a photomask layer over the insulating layer and removing a portion of the insulating layer.

17. The method of claim 16, wherein removing the portion of the insulating layer is free from exposing the carrier.

18. The method of claim 15, wherein forming the conductive contact in the trench comprises forming a conductive contact protruding from the insulating layer.

19. The method of claim 15, wherein forming the conductive contact in the trench comprises forming a conductive contact extending over a top surface of the insulating layer.

20. The method of claim 15, wherein exposing the conductive contact from the closed end of the trench in the insulating layer comprises a dry etch operation.

* * * * *